United States Patent
Coursey

(10) Patent No.: US 7,087,949 B2
(45) Date of Patent: Aug. 8, 2006

(54) SELECTIVE HEMISPHERICAL SILICON GRAIN (HSG) CONVERSION INHIBITOR FOR USE DURING THE MANUFACTURE OF A SEMICONDUCTOR DEVICE

(75) Inventor: Belford T. Coursey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 284 days.

(21) Appl. No.: 10/658,867

(22) Filed: Sep. 8, 2003

(65) Prior Publication Data
US 2005/0181574 A1    Aug. 18, 2005

Related U.S. Application Data

(62) Division of application No. 10/085,689, filed on Feb. 27, 2002, now Pat. No. 6,617,222.

(51) Int. Cl.
*H01L 27/108* (2006.01)
(52) U.S. Cl. ................................. 257/309; 257/532
(58) Field of Classification Search ............... 257/309, 257/532
See application file for complete search history.

(56) References Cited

U.S. PATENT DOCUMENTS

| | | | |
|---|---|---|---|
| 6,121,084 A * | 9/2000 | Coursey | 438/255 |
| 6,133,109 A | 10/2000 | Nam | 438/396 |
| 6,177,310 B1 | 1/2001 | Lin et al. | 438/255 |
| 6,287,935 B1 | 9/2001 | Coursey | 438/398 |
| 6,403,442 B1 | 6/2002 | Reinberg | 438/396 |
| 6,404,005 B1 | 6/2002 | DeBoer et al. | 257/309 |
| 6,538,274 B1 | 3/2003 | Zheng et al. | 257/296 |
| 6,617,222 B1 * | 9/2003 | Coursey | 438/398 |
| 6,693,320 B1 * | 2/2004 | DeBoer et al. | 257/309 |
| 6,781,183 B1 * | 8/2004 | Cho et al. | 257/309 |

* cited by examiner

*Primary Examiner*—Mark V. Prenty
(74) *Attorney, Agent, or Firm*—Kevin D. Martin

(57) ABSTRACT

A method used to form a semiconductor device comprises forming a layer such as a container capacitor layer having a bottom plate layer. The bottom plate layer is formed to define a receptacle, and a rim which defines an opening to an interior of the receptacle. The bottom plate layer is formed to have a smooth texture. Subsequently, an inhibitor layer is formed on the rim of the bottom plate layer while a majority of the receptacle defined by the bottom plate layer remains free from the inhibitor. With the inhibitor layer on the rim of the bottom plate layer, at least a portion of the receptacle is converted to have a rough texture, such as to hemispherical silicon grain (HSG) polysilicon, while subsequent to the conversion the smooth texture of the rim which defines the opening to the interior of the receptacle remains. A resulting structure is also described.

14 Claims, 22 Drawing Sheets

SELECTIVE HEMISPHERICAL SILICON GRAIN (HSG) CONVERSION INHIBITOR FOR USE DURING THE MANUFACTURE OF A SEMICONDUCTOR DEVICE

This is a division of U.S. application Ser. No. 10/085,689 filed Feb. 27, 2002 and issued Sep. 9, 2003 as U.S. Pat. No. 6,617,222.

FIELD OF THE INVENTION

This invention relates to the field of semiconductor manufacture and, more particularly, to a method for inhibiting hemispherical grain silicon (HSG) growth on selected locations of a container capacitor storage plate.

BACKGROUND OF THE INVENTION

During the manufacture of semiconductor devices which comprise memory elements, such as dynamic random access memories (DRAMs), static random access memories (SRAMs), and some microprocessors, container capacitors are commonly formed. Container capacitors are well known to allow an increased stored charge over planar capacitors by increasing the surface area on which the charge may be stored. To further increase the surface area on which the charge may be stored, polysilicon storage nodes are commonly converted to hemispherical silicon grain (HSG) polysilicon. This material has a roughened surface compared with non-HSG polysilicon and, therefore, an increased surface area on which a charge may be stored.

FIGS. 1–8 depict a conventional method for forming a container capacitor from HSG polysilicon. FIG. 1 depicts a semiconductor wafer substrate assembly 10 comprising a semiconductor wafer 12 having a plurality of doped areas 14 which allow proper operation of a plurality of transistors 16. Each transistor comprises gate oxide 18, a doped polysilicon control gate 20, silicide 22 such as tungsten silicide to increase conductivity of the control gate, and a capping layer 24 of tetraethyl orthosilicate (TEOS) oxide. Silicon nitride spacers 26 insulate the control gate 20 and silicide 22 from polysilicon pads 28 to which the container capacitors will be electrically coupled. Further depicted in FIG. 1 is shallow trench isolation (STI, field oxide) 30 which reduces unwanted electrical interaction between adjacent control gates, and a thick layer of deposited oxide 32 such as borophosphosilicate glass (BPSG). A patterned photoresist layer 34 defines the location of the container capacitors to be formed. The FIG. 1 structure may further include one or more bit (digit) lines under the TEOS layer or various other structural elements or differences which, for simplicity of explanation, have not been depicted.

The FIG. 1 structure is subjected to an anisotropic etch which removes the exposed portions of the BPSG layer to form a patterned BPSG layer which provides a base dielectric having a recess for the container capacitor. During this etch the polysilicon pads 28 and possibly a portion of TEOS capping layer 24 are exposed as depicted in FIG. 2. The remaining photoresist layer is stripped and any polymer (not depicted) which forms during the etch is removed according to means known in the art to provide the FIG. 3 structure.

As depicted in FIG. 4, a blanket polysilicon layer 40 is formed conformal with the deposited oxide layer, and will provide a container capacitor storage node for the completed capacitor. A thick blanket filler material 42, such as photoresist, is formed to fill the containers provided by polysilicon 40. The FIG. 4 structure is then subjected to a planarizing process, such as a chemical planarization, a mechanical planarization, or a chemical mechanical planarization (CMP) step. This process removes horizontal portions of the photoresist 42, the polysilicon 40, and usually a portion of the BPSG 32 to result in the FIG. 5 structure.

Next, the BPSG 32 is partially etched with an etch selective to polysilicon (i.e. an etch which minimally etches or, preferably, doesn't etch polysilicon) to result in the structure of FIG. 6. At this point in the process the polysilicon storage nodes 40 are only minimally supported. The bottom plates 40 in the FIG. 6 structure each comprise a first region 60 which defines a recess, and a second region 62 which defines an opening to the recess, with the first and second regions being continuous, each with the other. In other words, the bottom plate 40 of FIG. 6 defines a receptacle having a rim 62 which defines an opening to the interior of the receptacle. The regions 60, 62 form vertically-oriented sides of the bottom plate, and the sides are electrically-coupled by a horizontally-oriented bottom 64.

After etching the BPSG, a process is performed which converts the smooth polysilicon to HSG polysilicon storage plates 70 as depicted in FIG. 7. Various processes for converting the smooth polysilicon to HSG polysilicon are known in the art.

After performing the conversion of the smooth polysilicon to HSG polysilicon, a cell dielectric layer 80, for example a layer of high-quality cell nitride, a polysilicon container capacitor top plate 82, and a planar oxide layer such as BPSG 84 are formed according to means known in the art to result in the FIG. 8 structure. Subsequently, wafer processing continues according to means known in the art.

One problem which may result during the process described above is flaking of the HSG polysilicon from the storage node 70 as depicted in FIG. 9. These loose portions 90 are conductive and thus, when they break off and contact two adjacent conductive structures, can short the structures together and result in a malfunctioning or nonfunctioning device. Typically, the greatest number of such defect occurs proximate the top of the storage plates. This may occur as these ends are not protected by adjacent structures. This may also occur because, as wafer processing continues, the tops are the most likely portion of the storage plate to be contacted during a CMP or other step, and also incur the highest stresses.

Another problem which may occur with the process described above results from the very close lateral spacing between adjacent storage plates. As a design goal of semiconductor engineers is to form as many storage capacitors per unit area as possible, and there are typically several million storage capacitors on each memory chip, even a small decrease in spacing between features can allow for the formation of many more features in the same area. Thus the capacitors are formed as close together as wafer processing will allow. As the roughened polysilicon grains grow, grains from two adjacent plates can form a bridge 92 between the two plates and thus short them together to result in a malfunctioning device.

A method used to form roughened polysilicon container capacitor storage plates which reduces or eliminates the problems described above, and a structure resulting therefrom, would be desirable.

SUMMARY OF THE INVENTION

The present invention provides a new method which, among other advantages, reduces problems associated with the manufacture of semiconductor devices, particularly problems resulting during the formation of hemispherical silicon grain (HSG) polysilicon container capacitor storage plates. In accordance with one embodiment of the invention a container capacitor layer is formed, for example from polysilicon, which comprises a first region defining a recess and a second region defining an opening to the recess. The first and second regions are formed having a smooth texture. Next, an inhibitor layer is formed over the second region of the container capacitor layer while a majority of the first region of the container capacitor layer remains free from the inhibitor layer. With the inhibitor layer extending over the second region of the container capacitor layer, at least a portion of the first region is converted to have a second texture which is rougher than the first texture, for example a conversion to HSG polysilicon. Subsequent to this conversion, the second region still has the first, smoother texture. Finally, the conversion inhibitor layer may be removed and is therefore a sacrificial layer, or more preferably it may be left in place, and wafer processing continues to complete the semiconductor device.

Using this process, the highest defect source for HSG flaking is removed, which results in decreased device defects. Various embodiments of the invention are described.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Various embodiments of the invention provide a hemispherical silicon grain (HSG) polysilicon inhibitor layer over selected locations of the smooth polysilicon to inhibit HSG growth in those locations during HSG conversions of other locations of the smooth polysilicon. The processes described herein may reduce the likelihood of HSG polysilicon flaking from the container capacitor bottom plate, thereby reducing defects resulting from this flaking. Various inventive processes described herein may also reduce the likelihood of bridging of the HSG polysilicon between adjacent container capacitor storage plates.

Figure 11:
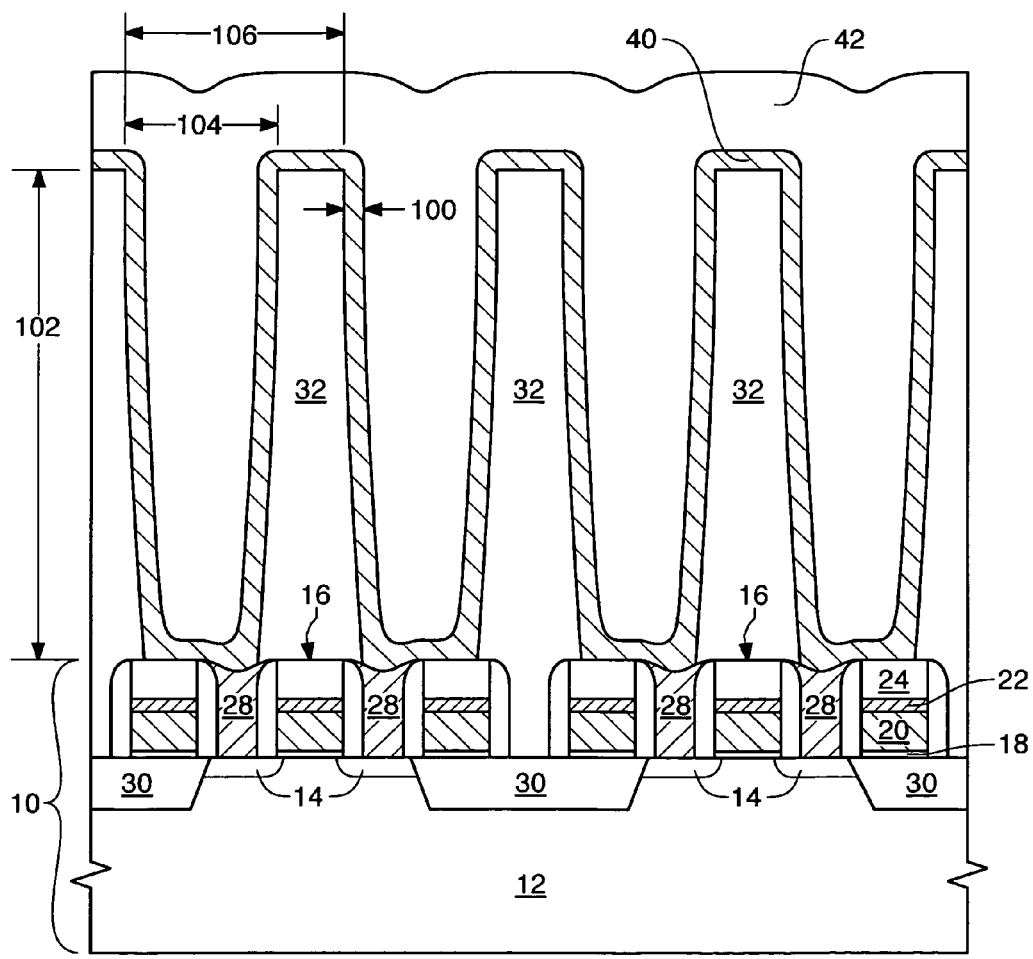
FIGS. 11–16 are cross sections depicting a first embodiment of the invention which forms an HSG polysilicon inhibitor layer over a region of the container capacitor storage plate while a second region remains free from the inhibitor layer.

A first embodiment of the invention is depicted by FIGS. 11–16. The structure of FIG. 11 is manufactured to have a polysilicon bottom plate 40 with thickness 100 of between about 150 angstroms (Å) and about 1,000 Å and a container capacitor height 102 of between about 1,000 Å and about 60,000 Å (60KÅ). The outside width dimension 104 of each storage plate at the top is between about 800 Å and about 5KÅ. Further, the circumference (not depicted) of the outside of the storage plate at the top is between about 1,800 Å and about 12 KÅ, and the pitch 106 of the storage plates is between about 800 Å and about 5KÅ. This structure can be manufactured by one of ordinary skill in the art from the description herein.

In one embodiment of the invention, the smooth polysilicon layer is formed in a continuous layer but is more heavily doped, for example with phosphorous, as it is initially formed. As the thickness increases during its formation, less dopant is integrated into the layer. This ensures an adequate electrical connection between pad 28 and the bottom plate 40. The portion of the layer formed first, which has the heaviest doping, may be doped to between about $1\ E^{18}$ atoms/cm$^3$ to about $1\ E^{21}$ atoms/cm$^3$. The portion of the layer formed last will, typically, remain undoped or may be only minimally doped. The layer is formed as a continuously thick layer, but comprises a decreasing gradient of doping from the bottom to the top of the layer. Having little or no doping at the top of the smooth polysilicon layer provides a resulting HSG layer which is of higher quality than an HSG layer which is formed from a doped smooth polysilicon layer. A conductive layer of conductively-doped polycrystalline silicon 40 between about 50 Å and about 150 Å may be formed using plasma enhance chemical vapor deposition (PECVD) techniques. For example, silane gas (SiH$_4$) is introduced as a silicon source into a deposition chamber at a flow rate of between about 400 sccm and about 600 sccm along with phosphine (PH$_3$) at a flow rate of between about 5 sccm and about 15 sccm at a temperature of between about 500° C. and about 600° C. for a duration of between about 2.5 minutes and about 15 minutes. Using this process the preferred material is formed at a rate of between about 10 Å/min to about 20 Å/min. As the layer forms the PH$_3$ flow rate may be decreased to 0 sccm over a period of about 10 seconds as the layer approaches about half its final thickness. This forms a layer 40 as depicted in FIG. 11 of between about 50 Å and about 150 Å thick.

Next, a layer of protective material 42, for example photoresist, is provided. Photoresist is typically spun on, and in this embodiment a target thickness of between about 1,000 Å and about 60KÅ is formed according to means known in the art from the description herein. This layer fills the recesses defined by the polysilicon layer 40. The FIG. 11 structure is planarized, for example using mechanical polishing such as chemical mechanical polishing (CMP), to form the FIG. 12 structure. This planarization removes the horizontal portions of the polysilicon from the surface of the structure, thereby disconnecting adjacent container capacitors. The planarization further leaves the photoresist within the containers and provides a planar surface from which to continue processing.

Figure 12:
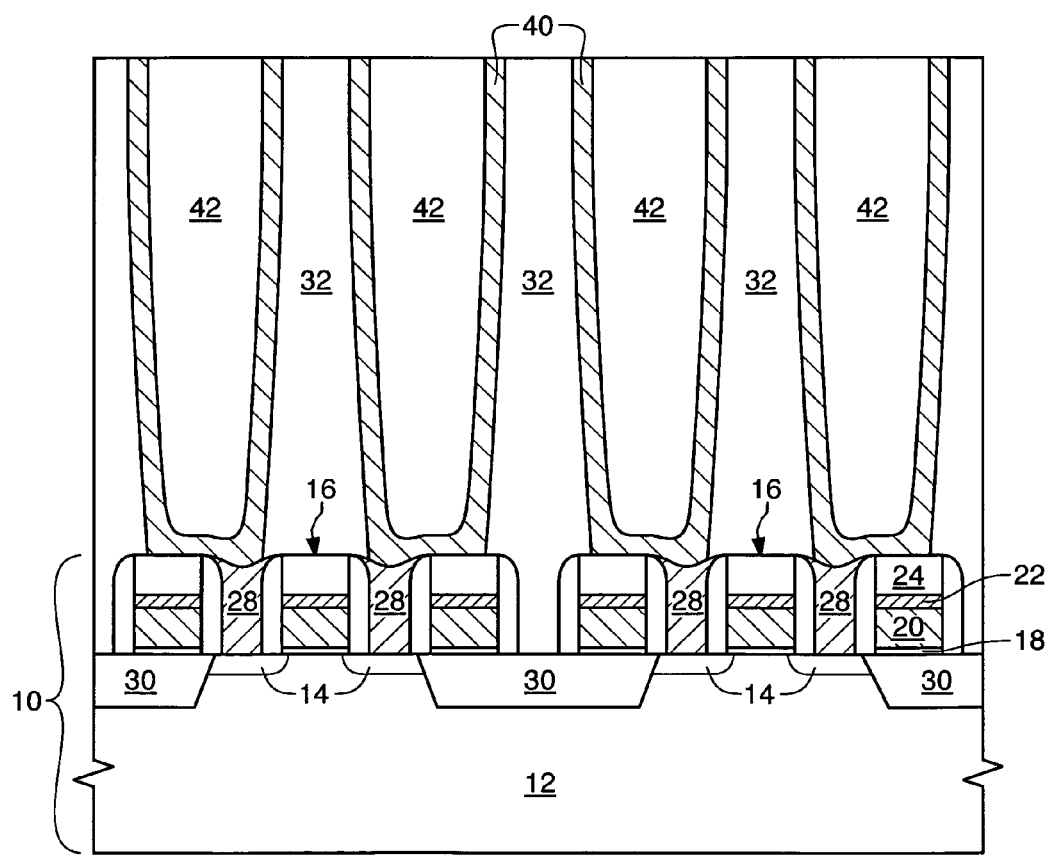

The FIG. 12 structure is subjected to a high temperature ash step, which ashes the photoresist to facilitate its removal, and then to a wet etch, for example using hydrofluoric acid (HF) to remove the photoresist ash and also a portion of BPSG 32. This process is selective to polysilicon, and thus the structure of FIG. 13 remains.

Figure 13:
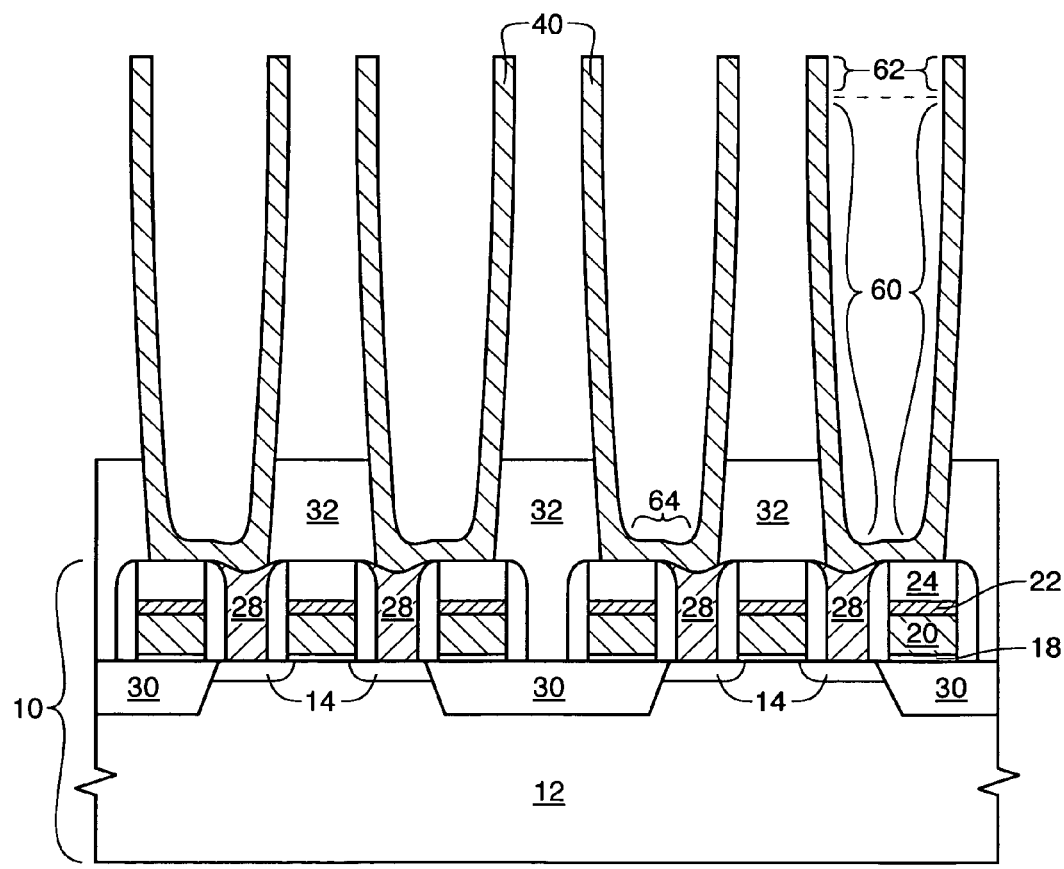
Figure 14:
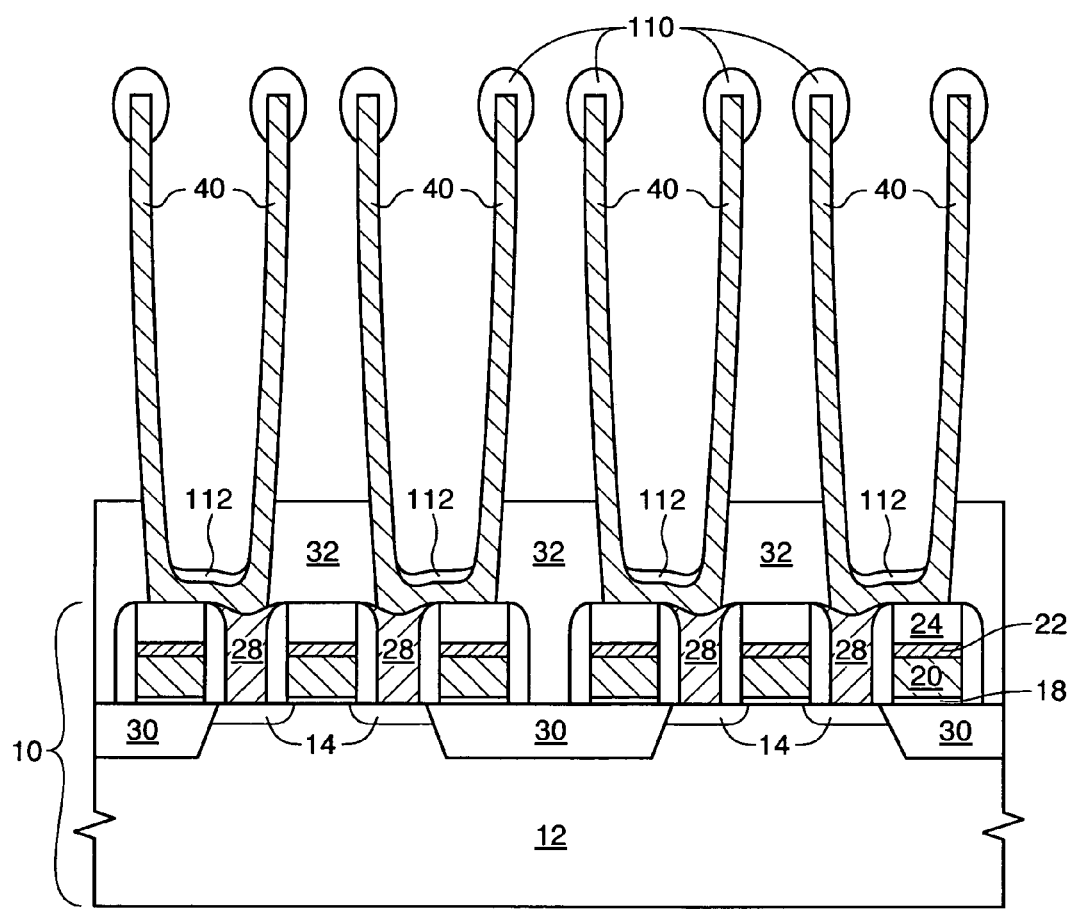

After forming the FIG. 13 structure, a HSG polysilicon conversion inhibitor layer 110 is formed as depicted in FIG. 14. Various materials may be used for this layer, but will preferably be a dielectric layer which can be formed using a process which provides poor step coverage (i.e. which forms over horizontal surfaces but minimally or not at all over vertical surfaces). For example, a PECVD silicon nitride ($Si_3N_4$) layer having a target thickness of between about 30 Å and about 500 Å would be sufficient. Such a layer may be formed by a plasma reaction process comprising the use of silane gas ($SiH_4$), ammonia ($NH_3$), and nitrogen gas ($N_2$). A low silane flow (LSO) dielectric layer having a target thickness of between about 50 Å and about 500 Å may also be sufficient. An LSO layer may be formed by a plasma reaction process, for example in a plasma enhanced chemical vapor deposition (PECVD) chamber. Such a layer may be formed by flowing $SiH_4$ at a flow rate of between about 10 standard cubic centimeters (sccm) and about 500 sccm, and more preferably at a flow rate of between about 50 sccm and about 200 sccm, and nitrous oxide ($N_2O$) at a flow rate of between about 500 sccm and 5,000 sccm, and more preferably at a flow rate of between about 2,000 sccm and about 2,400 sccm. This LSO layer may be formed at a temperature of between about 100° C. and about 600° C. for a duration of between about five seconds and about five minutes at a chamber pressure of between about one Torr and about 10 Torr, and more preferably at a pressure of between about two Torr and about 2.2 Torr.

Other materials which may function for the inhibitor layer include TEOS, BPSG, and phosphosilicate glass (PSG), generally having a target thickness of between about 50 Å and about 500 Å, any of which can be formed by one of ordinary skill in the art from the information herein.

Figure 15:
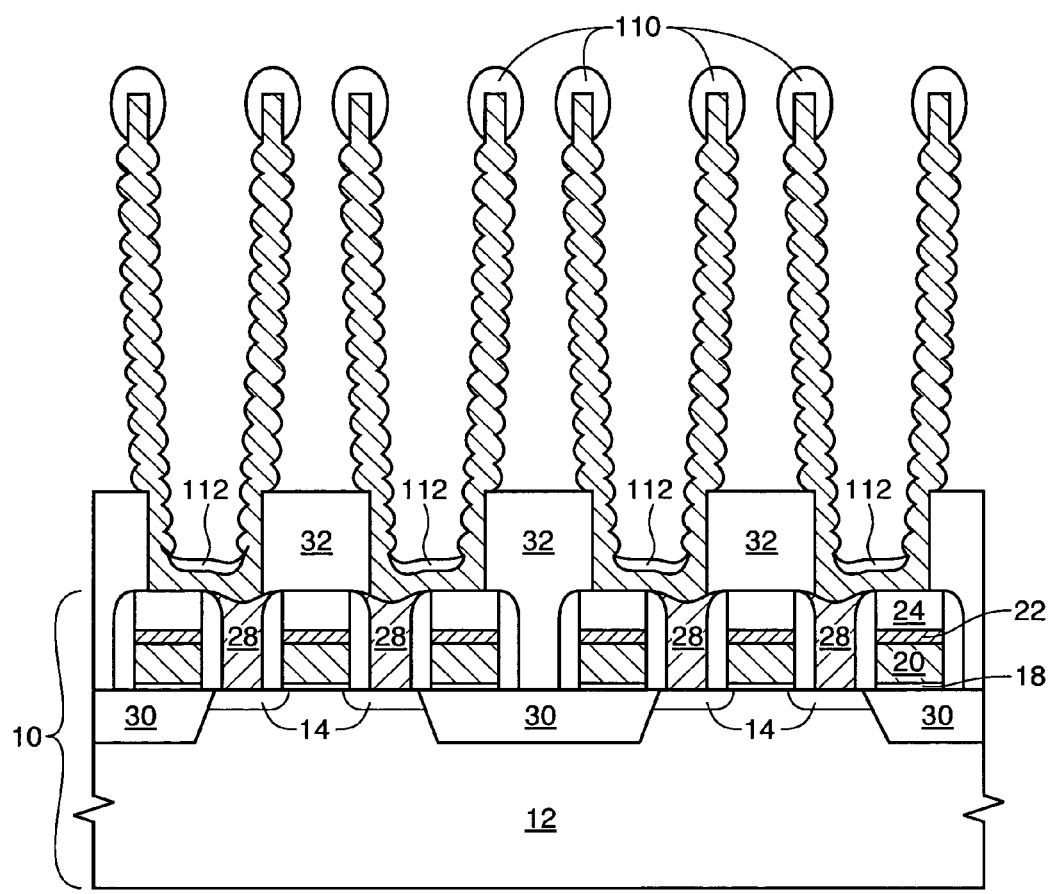
Figure 16:
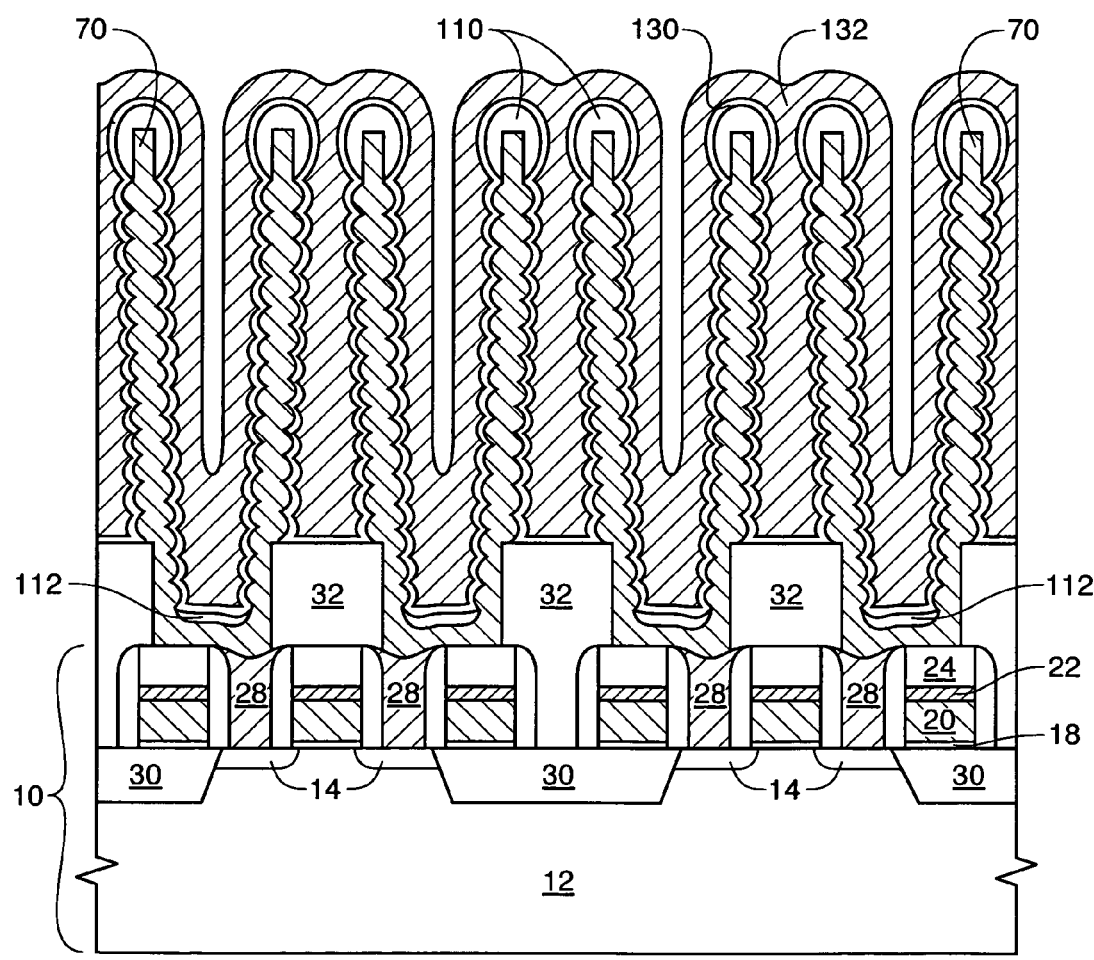

While it is preferable that these materials form only at the locations depicted by structures 110 in FIG. 14, they may also form undesirably on the horizontal portions of the inside of the recess defined by the polysilicon layer as depicted by structures 112 in FIGS. 14–16. This layer 110, 112 will inhibit conversion of the polysilicon to HSG polysilicon at these locations, but the decrease in capacitance between the bottom and top plates of the completed capacitor will be minimal, as a majority of the bottom plate remains free from the inhibitor layer.

After forming the FIG. 14 structure, the polysilicon 40 is converted to HSG polysilicon 120 as depicted in FIG. 15. This step may be performed using disilane gas ($Si_2H_6$) in a CVD system. The disilane gas is decomposed into silicon radicals, then nucleation is performed and the smooth polysilicon is converted to HSG silicon.

It has been found that the majority of the flaking of the HSG polysilicon from the bottom plate occurs at the top region of the feature, and more particularly at the interface between the highly doped portion and the portion which has little or no doping. The inhibitor layer 110 reduces HSG conversion and, more preferably, prevents HSG conversion, at these high-defect locations. Thus, the majority of the flaking can be prevented by leaving this portion of the bottom plate as smooth polysilicon. This will decrease the capacitance between the bottom plate and the completed top plate, but as the converted to unconverted polysilicon remains high, for example greater than about 98% with the embodiment described above, capacitance only decreases minimally.

After converting the smooth polysilicon to HSG polysilicon as depicted in FIG. 15, the inhibitor layer is left in place. Leaving the inhibitor layer in place has been found during testing to actually improve the performance of the completed cell over structures produced with the same process except where the inhibitor layer is removed. The capacitance was found to be roughly equal in cells formed with and without the inhibitor, but cell leakage was improved (decreased charge leakage) in cells with which the inhibitor layer was left in place during subsequent processing. While the exact mechanism for this improvement has not been studied, it may occur because of added protection of the upper cell layer during subsequent process. However, if it is desirable to remove this layer, the inhibitor layer may be considered a sacrificial layer and can be removed selective to the HSG polysilicon using a hydrofluoric acid bath. Such a process for etching oxide selective to polysilicon is well known in the art.

Subsequently, a cell dielectric layer 130, for example cell nitride, and a capacitor top plate layer 132 are formed. Wafer processing continues according to means known in the art.

This first embodiment provides a device having the top plate formed on both the inside and outside of the bottom plate layer, also called a "double-sided container capacitor," which has less flaking and therefore reduced defects resulting from the flaking.

Figure 1:
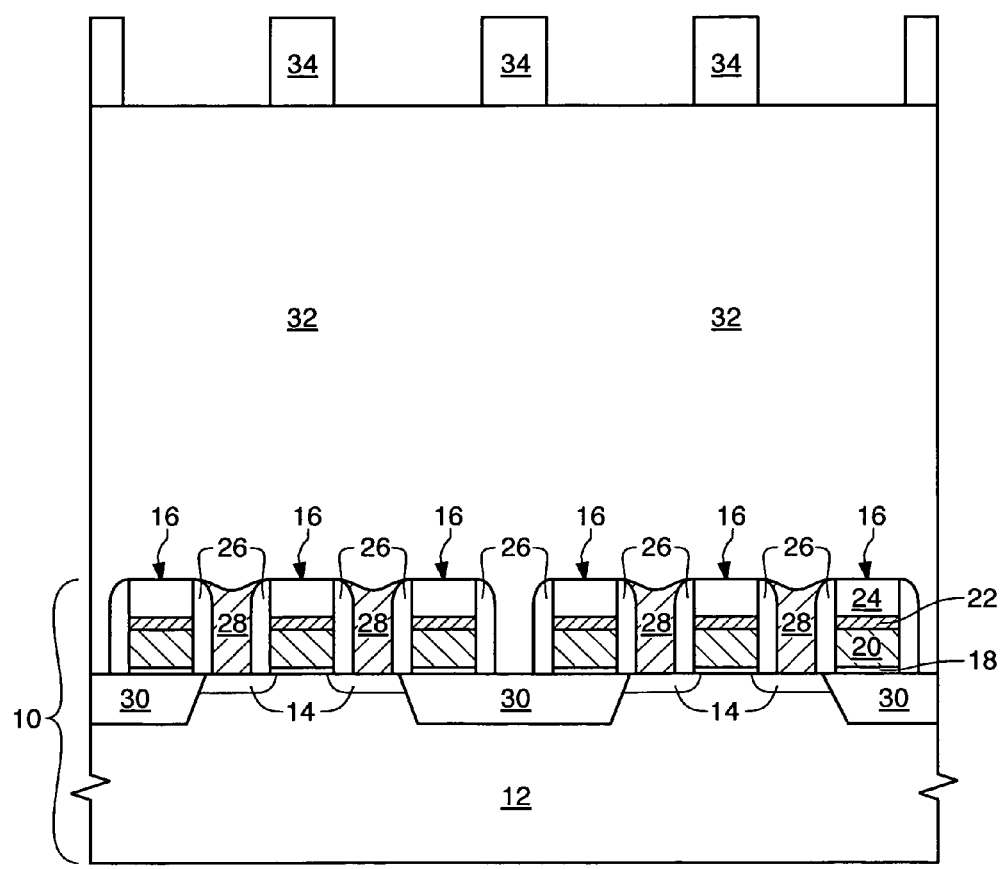
FIGS. 1–8 are cross sections depicting a conventional process for forming a container capacitor.
Figure 2:
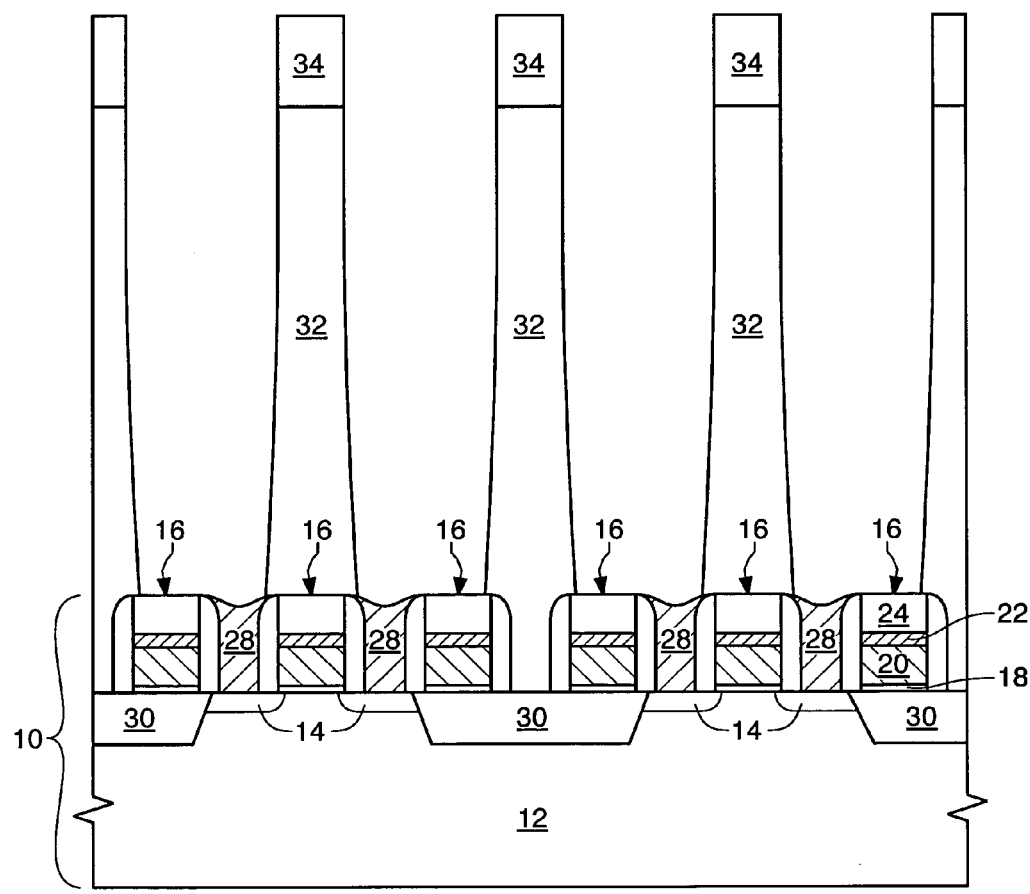
Figure 3:
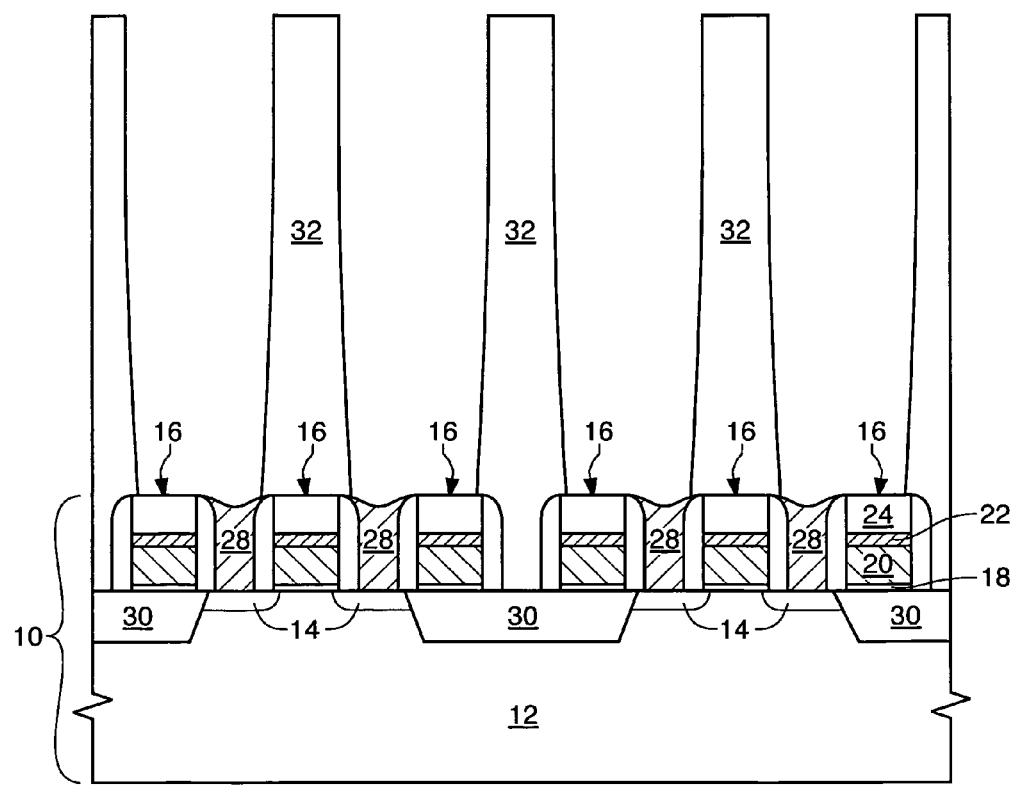
Figure 4:
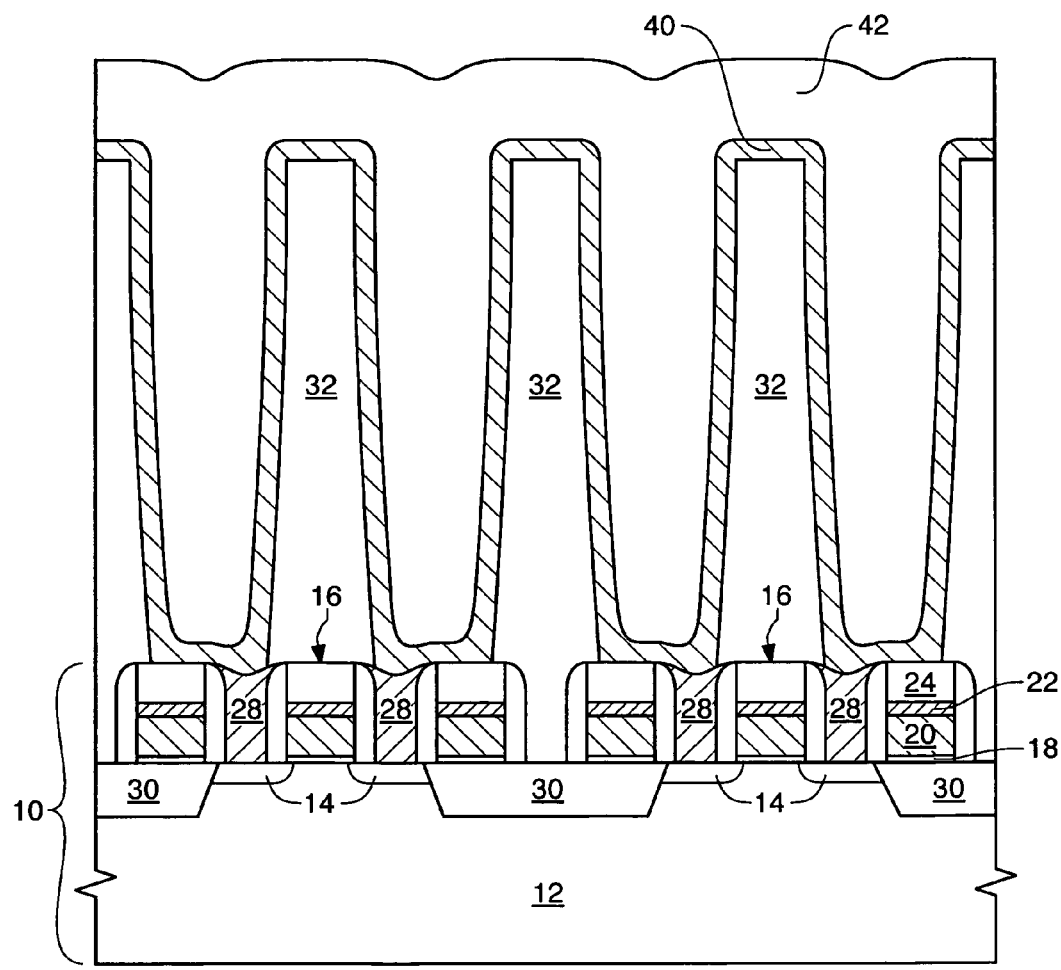
Figure 5:
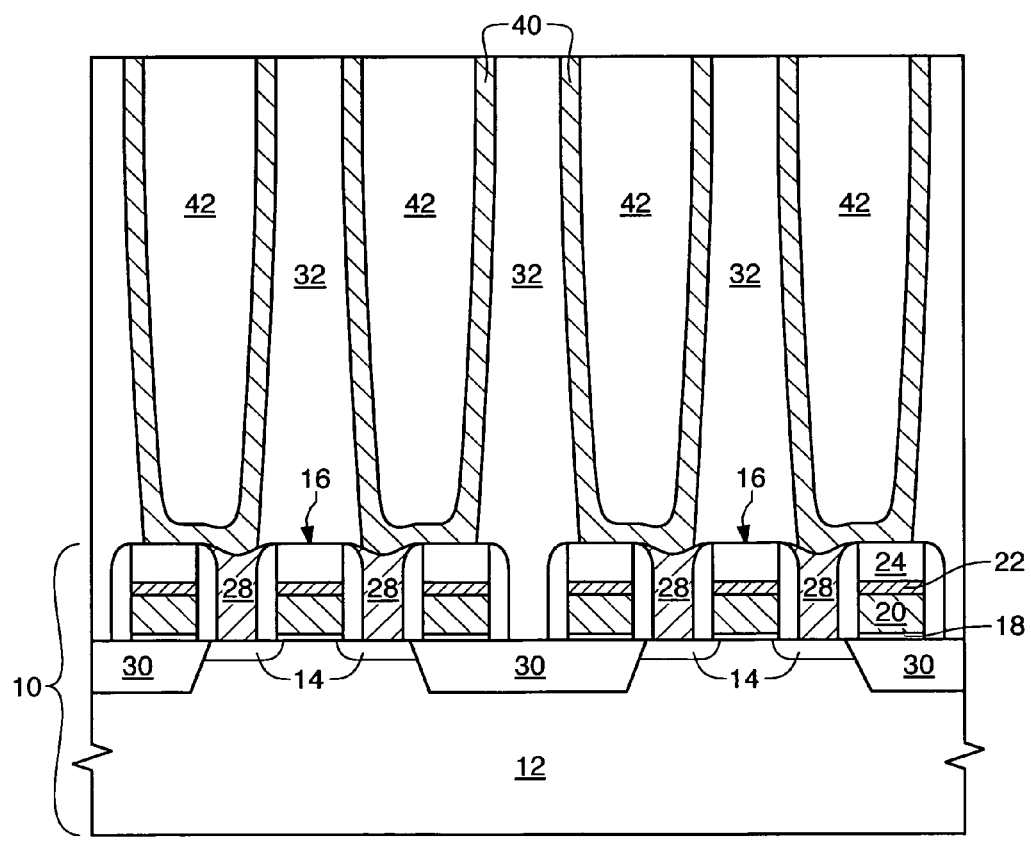
Figure 6:
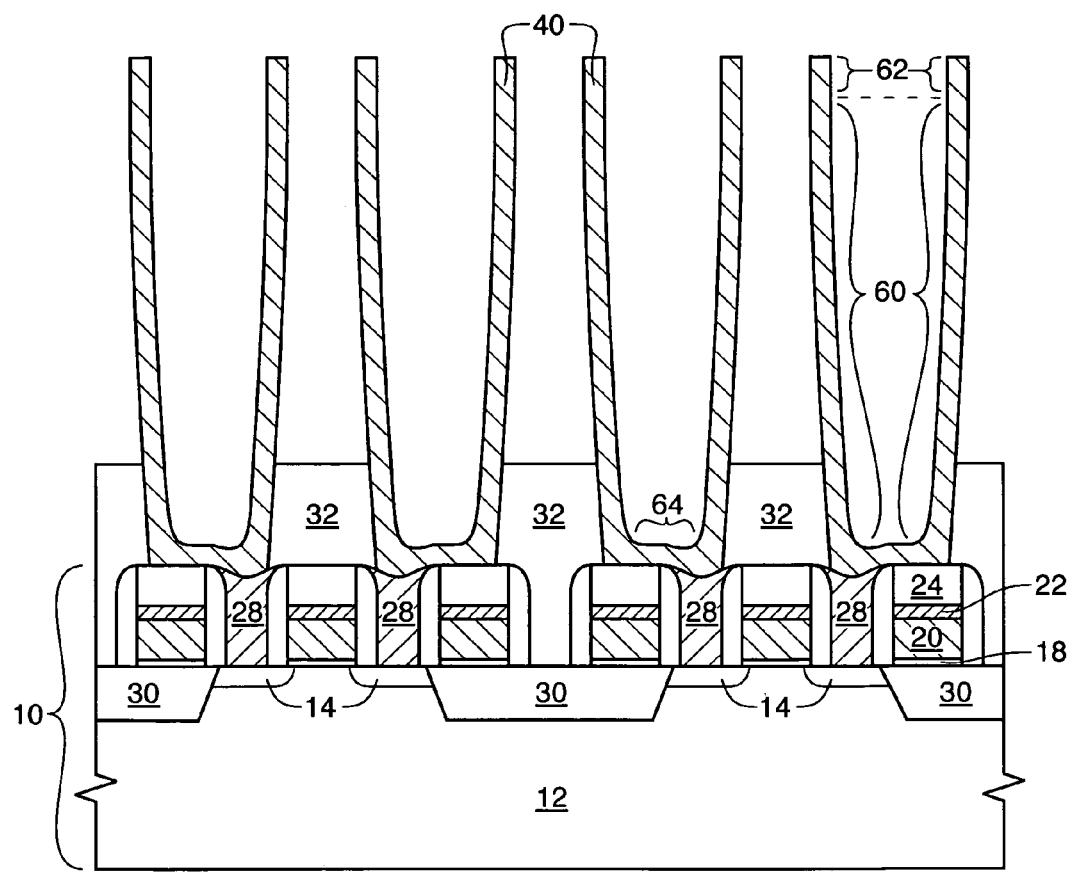
Figure 7:
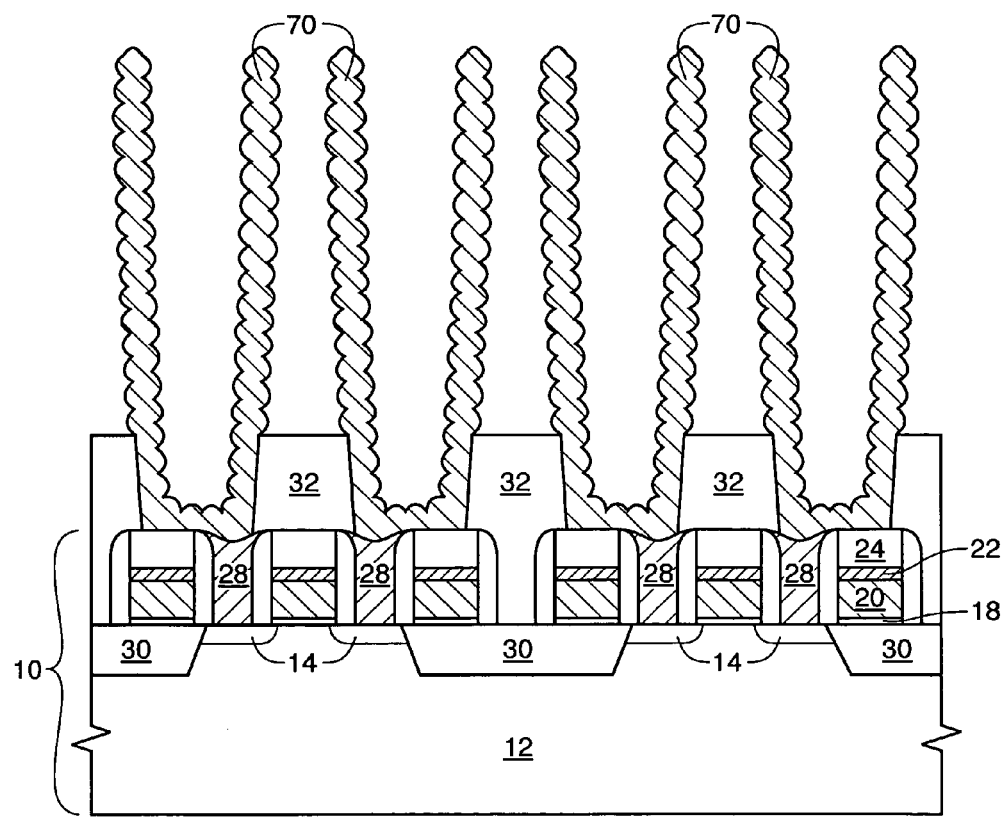
Figure 8:
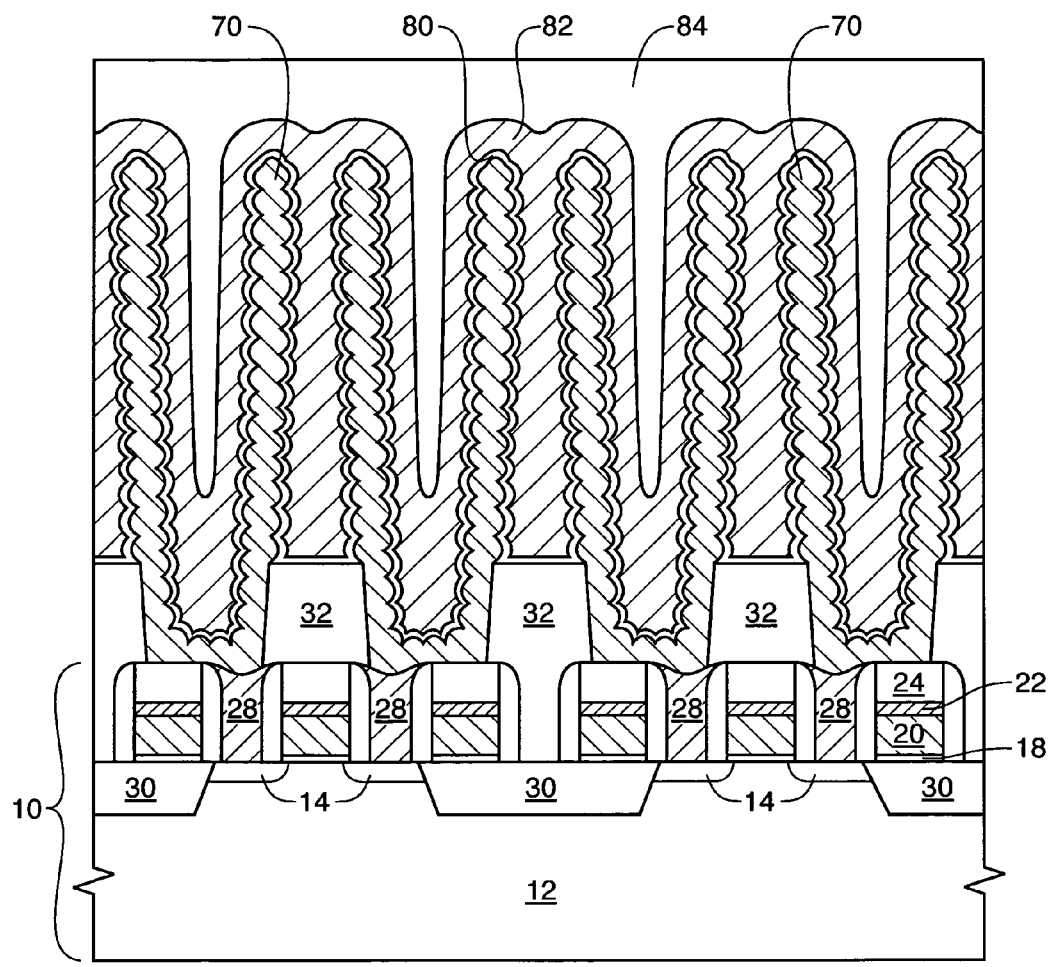
Figure 17:
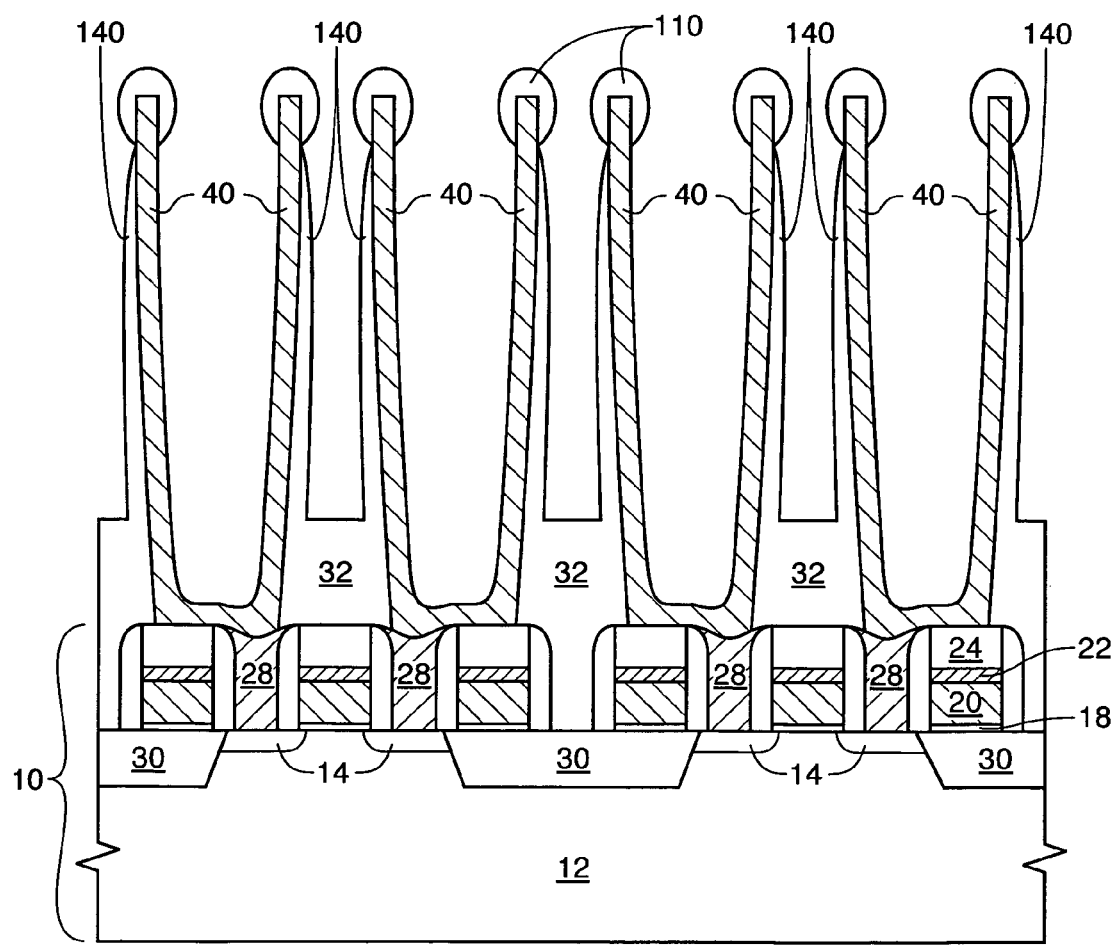
FIGS. 17–19 are cross sections depicting a second embodiment of the invention.

FIGS. 12 and 17–19 depict a second embodiment of the invention to form a double-sided container capacitor structure. In this embodiment the structure of FIG. 12 is formed according to means known in the art from the description herein. Subsequently, a highly anisotropic BPSG etch is performed to etch the BPSG 32 selective to the polysilicon bottom plate 40 and the photoresist 42. This etch is selected to provide as vertical of an etch with little or no lateral etching of the BPSG as possible. An exemplary etch includes flowing about 40 sccm $CF_4$, 15 sccm $CH_2F_2$, and about 150 sccm argon in a reactive ion etch (RIE) process using a chamber pressure of about 50 millitorr, a power of about 600 Watts, and a bottom electrode temperature of about 20° C. As the bottom plates are slightly rounded, resulting from the BPSG etch which results in the FIG. 2 structure, the bottom plates are also necessarily rounded. During the highly vertical BPSG etch, the bottom plate protects the BPSG along the outside of the bottom plates and results in the BPSG coating 140 on the bottom plates as depicted in FIG. 17.

After etching the BPSG, the photoresist is removed and the inhibitor layer 110 is formed. Removal of the resist and formation of the inhibitor may be performed using the processes previously described, thereby resulting the in structure of FIG. 17.

Figure 9:
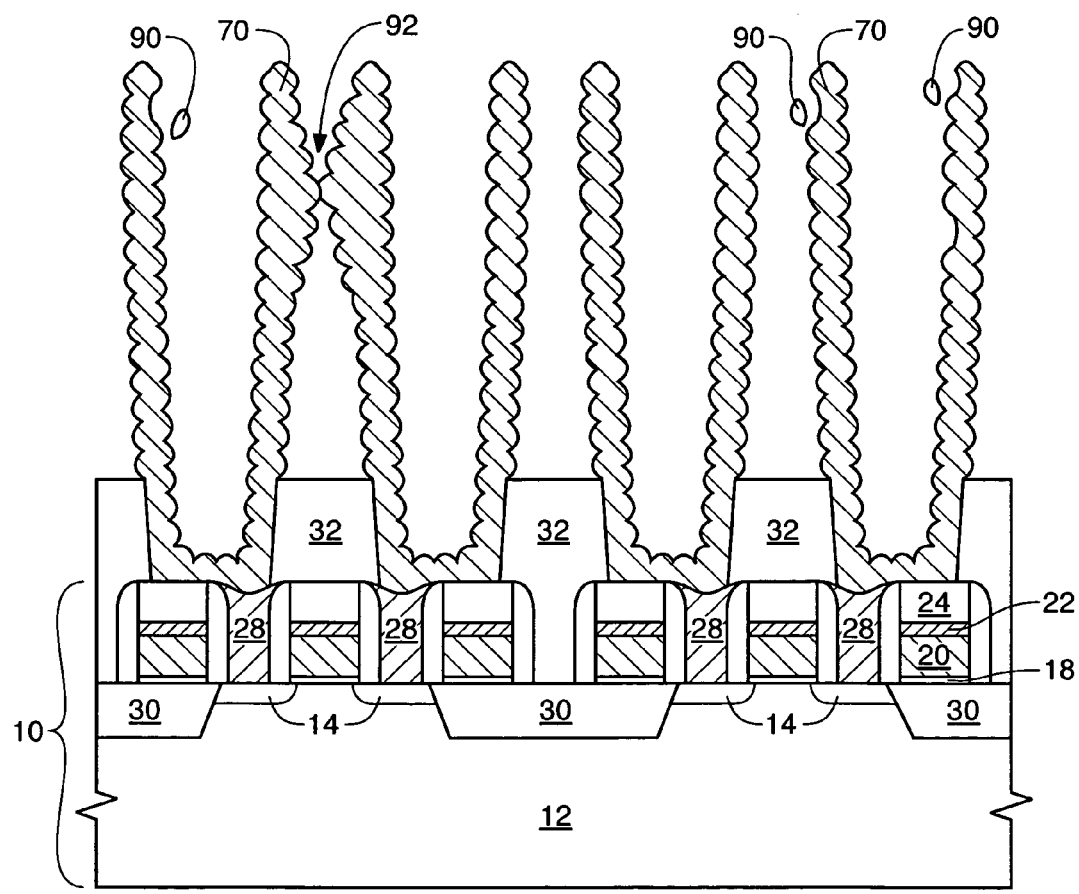
FIG. 9 is a cross section depicting two possible failure modes which may occur during the conventional process of FIGS. 1–8.
Figure 10:
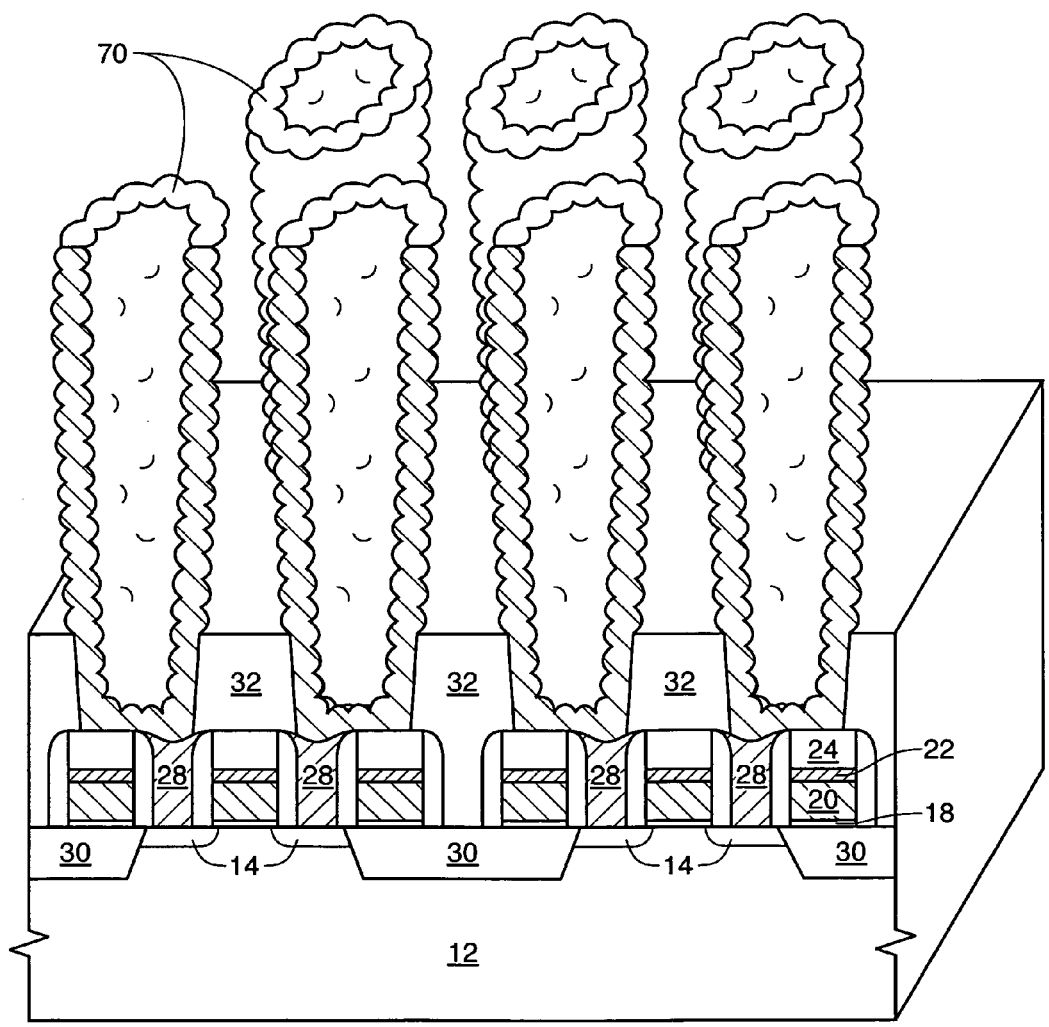
FIG. 10 is a cross-sectional isometric view depicting an array of container capacitor storage plates prior to formation of cell dielectric and the capacitor top plate.
Figure 18:
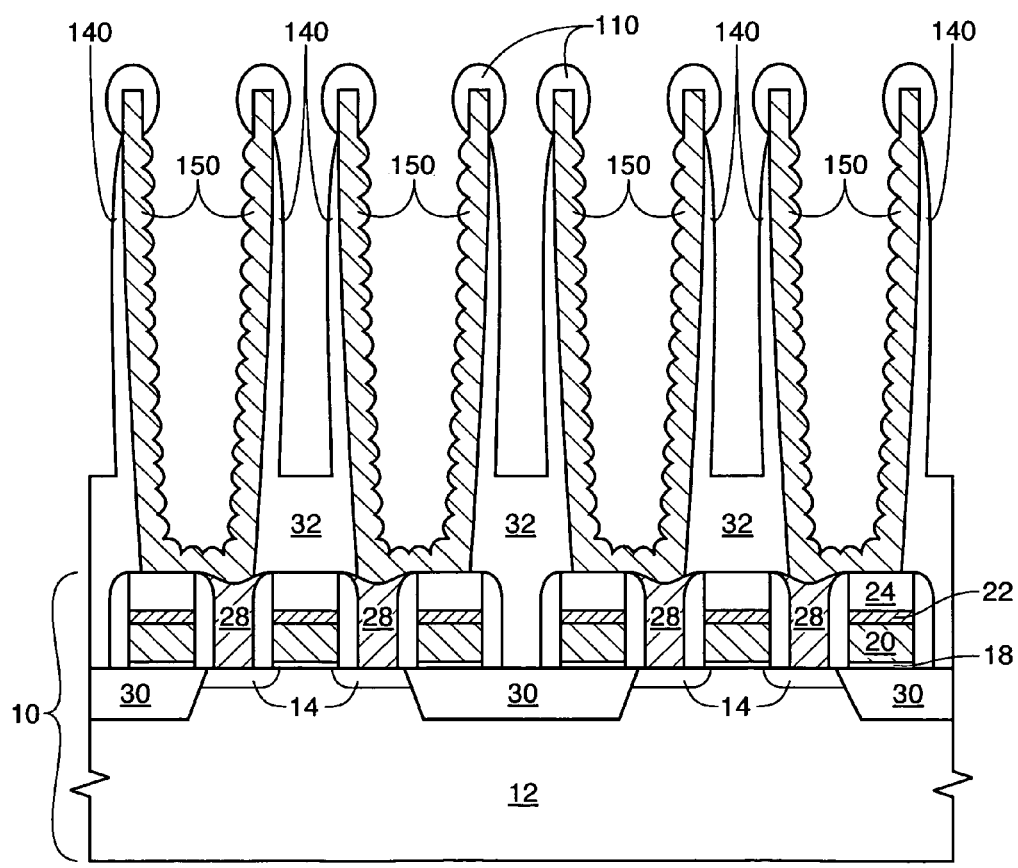
Figure 19:
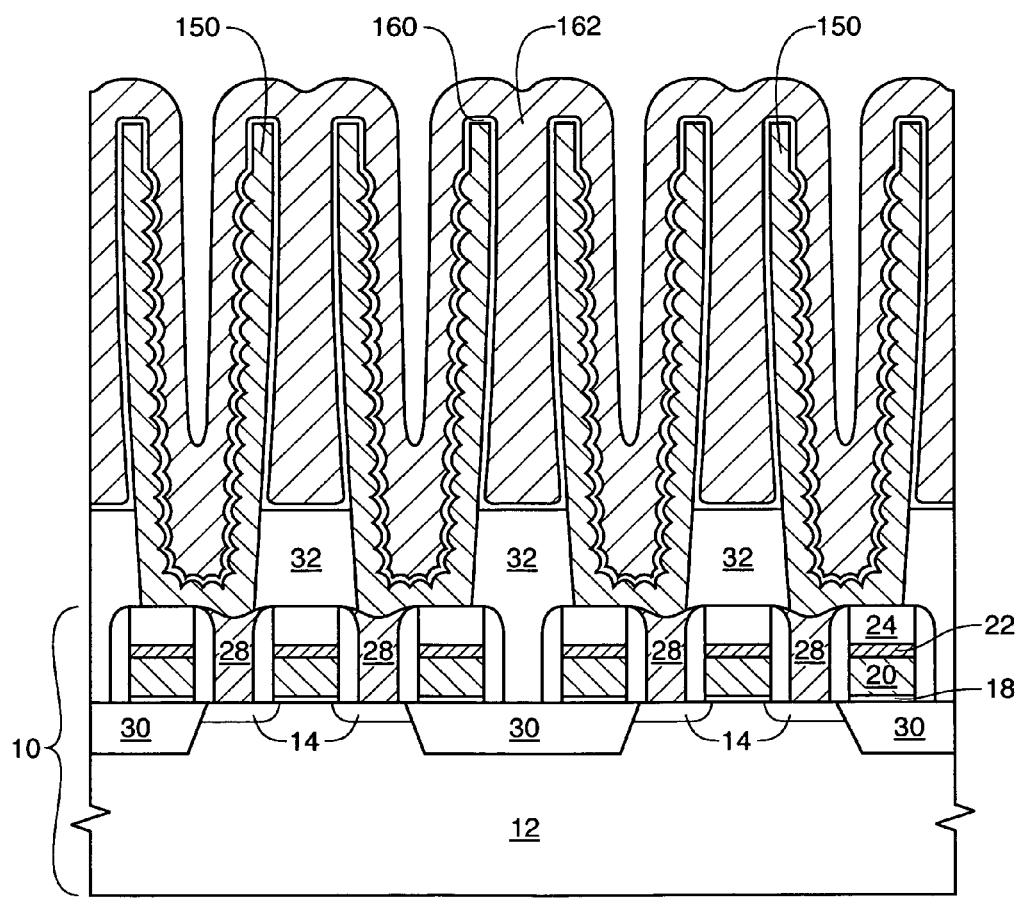
Figure 20:
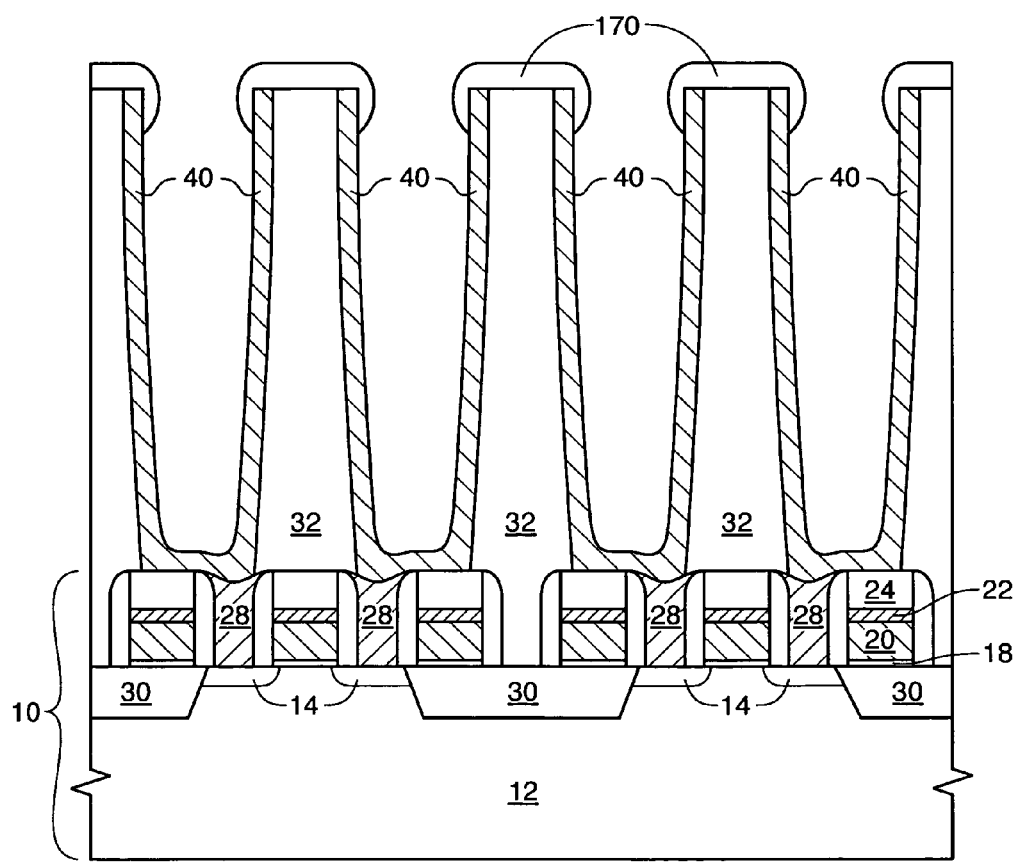
FIGS. 20–22 are cross sections depicting a third embodiment of the invention.

Next, the polysilicon bottom plate is converted to HSG polysilicon, for example according to the process previously described, to result in the bottom plate structure 150 of FIG. 18. Next, layer 140 is removed, for example using an HF wet etch, which also necessarily removes inhibitor 110. Wafer processing then continues form cell dielectric 160, for example cell nitride, and a container capacitor top layer 162, for example a polysilicon layer between about 200 Å thick and about 2 KÅ thick as depicted in FIG. 19. With this process, the HSG polysilicon does not form on the outside of the bottom plate, and thus bridging 92 of the HSG polysilicon between adjacent bottom plates as depicted in FIG. 9 is less likely, while still providing a double-sided capacitor structure. As a significant portion of the polysilicon bottom plate is not converted to HSG polysilicon, this structure will have a significant reduction in capacitance between the bottom and top plates as compared with the double-sided embodiment of FIG. 16. However, the capacitance will be a significant increase over single-sided container capacitor configurations.

FIGS. 12 and 20–22 depict an embodiment of the inventive process for forming a single-sided container capacitor. In this embodiment, the structure of FIG. 12 is formed as described above. Next, photoresist is removed, for example according to the process previously described. The BPSG 32 is not etched in this embodiment, but remains level with the top of the capacitor bottom plate. The inhibitor 170 is formed, for example according the process previously described, to result in the structure of FIG. 20.

Figure 21:
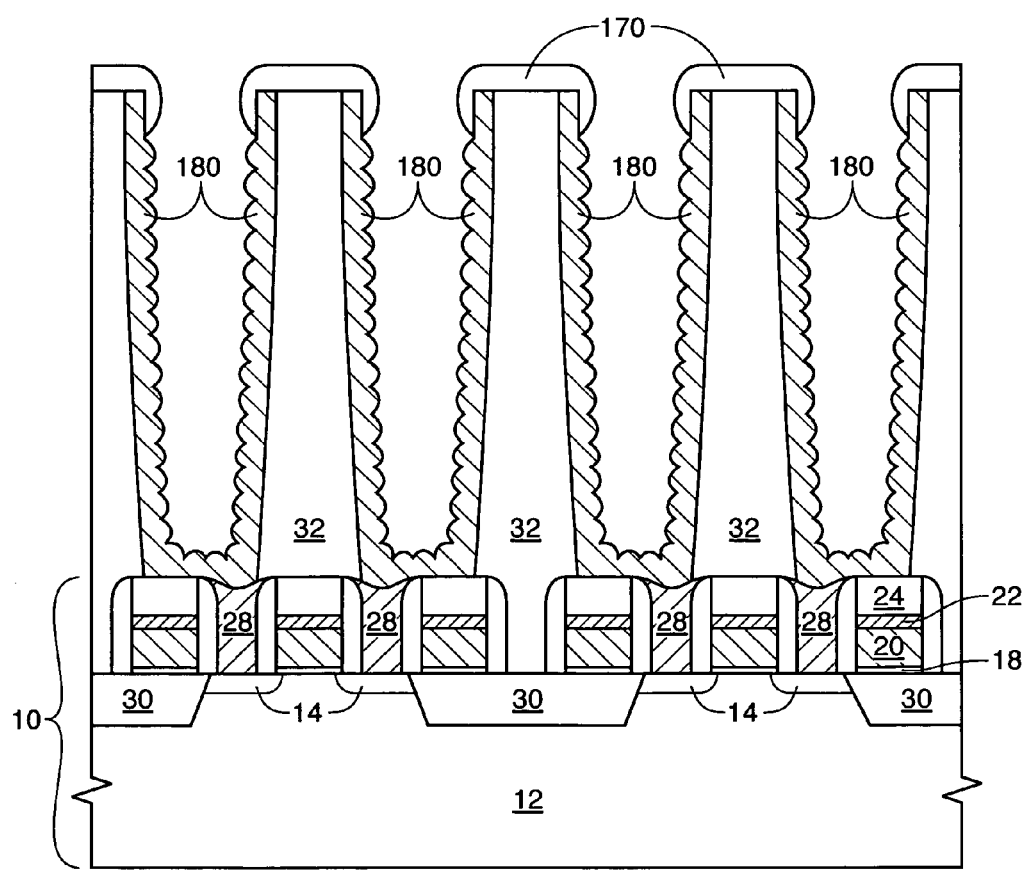
Figure 22:
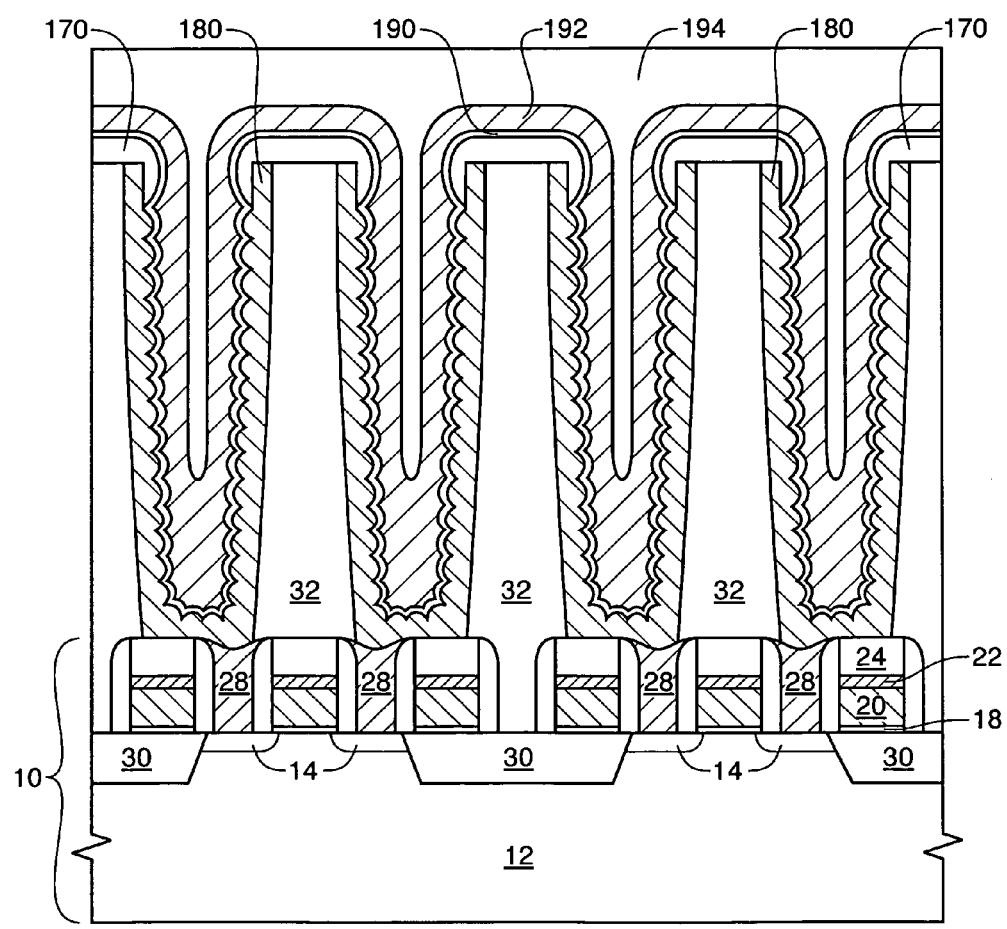

Subsequently, the polysilicon bottom plate is converted to HSG polysilicon 180 as depicted in FIG. 21, for example using the process described above. Finally, the inhibitor layer is removed, or preferable left in place as depicted, and cell dielectric 190, the capacitor top plate 192, and a planar dielectric layer 194 are formed according to means known in the art from the description herein to result in the FIG. 22 structure. Wafer processing continues according to means known in the art.

It is contemplated that semiconductor device comprising the invention may be attached along with other devices to a printed circuit board, for example to a computer motherboard or as a part of a memory module used in a personal computer, a minicomputer, or a mainframe. The inventive device may further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
a patterned deposited dielectric layer comprising a plurality of recesses therein;
a capacitor bottom plate formed within said recess;
an inhibitor layer covering only an upper region of said capacitor bottom plate such that a lower region of said capacitor bottom plate is not covered by said inhibitor layer, wherein said upper region of said capacitor bottom plate is smooth polysilicon and said lower region of said capacitor bottom plate is roughened polysilicon;
a capacitor cell dielectric layer formed over said inhibitor layer and over said bottom plate; and
a capacitor top plate layer formed over said cell dielectric layer, over said inhibitor layer, and over said capacitor bottom plate.

2. The semiconductor device of claim 1, wherein:
said lower region of said capacitor bottom plate is hemispherical silicon grain (HSG) polysilicon;
said upper region of said capacitor bottom plate is smooth polysilicon; and
said inhibitor layer is oxide.

3. The semiconductor device of claim 2 wherein said inhibitor layer is low silane flow oxide.

4. The semiconductor device of claim 1 wherein said inhibitor layer is nitride.

5. A semiconductor device comprising:
a conductive container capacitor bottom plate layer comprising a single polysilicon layer;
a first portion of said bottom plate layer which defines two adjacent receptacles, wherein said first portion of said bottom plate layer comprises a first texture;
a second portion of said bottom plate layer which defines a rim to an interior of said two receptacles, wherein said second portion of said bottom plate layer comprises a second texture which is smoother than said first texture;
a dielectric layer interposed between two adjacent receptacles of the plurality of receptacles;
an inhibitor layer contacting said dielectric layer and said second portion of said bottom plate layer which defines the rim to the interior of said two adjacent receptacles; and
a cell dielectric layer formed over said bottom plate layer which contacts said first portion and said second portion of said bottom plate layer of the two adjacent receptacles.

6. The semiconductor device of claim 5, wherein:
said first portion of said container capacitor bottom plate layer is hemispherical silicon grain (HSG) polysilicon; and
said second portion of said container capacitor bottom plate layer is smooth polysilicon.

7. A semiconductor device comprising a container capacitor, said container capacitor comprising:
a capacitor bottom plate having a bottom and an inside which together define a receptacle, a rim which defines an opening to an interior of said receptacle, and an outside;
an inhibitor layer is on said bottom and on said rim of said capacitor bottom plate, wherein said bottom and said rim of said capacitor bottom plate have a first texture and said inside of said capacitor bottom plate has a second texture which is rougher than said first texture;
a capacitor cell dielectric is on said inhibitor layer on said bottom and said rim of said capacitor bottom plate, on said inside of said capacitor bottom plate, and over said outside of said capacitor bottom plate; and
a capacitor top plate formed on said cell dielectric layer.

8. The semiconductor device of claim 7 further comprising a dielectric layer which covers said outside of said capacitor bottom plate, wherein said outside of said bottom plate has said first texture.

9. The semiconductor device of claim 7 wherein said cell dielectric layer contacts a majority of said outside of said capacitor bottom plate, and said majority of said outside of said capacitor bottom plate has said second texture.

10. The semiconductor device of claim 1, wherein:
said lower region of said capacitor bottom plate is hemispherical silicon grain (HSG) polysilicon;
said upper region of said capacitor bottom plate is smooth polysilicon; and
said inhibitor layer is silicon nitride.

11. An electronic device comprising at least one semiconductor device, wherein the semiconductor device comprises:
a patterned deposited dielectric layer comprising an opening therein;
a capacitor bottom plate at least partially formed within the opening in the dielectric layer;
an inhibitor layer covering an upper region of the capacitor bottom plate such that at least a portion of the lower region of the capacitor bottom plate is not covered by the inhibitor layer, wherein the upper region of the capacitor bottom plate is smooth polysilicon and the lower region of the capacitor bottom plate is roughened polysilicon;

a capacitor cell dielectric layer formed over the inhibitor layer and over the bottom plate; and a capacitor top plate layer formed over the cell dielectric layer, over the inhibitor layer, and over the capacitor bottom plate.

12. The electronic device of claim 11, wherein the at least one semiconductor device further comprises:

the lower region of the capacitor bottom plate is hemispherical silicon grain (HSG) polysilicon;

the upper region of the capacitor bottom plate is smooth polysilicon; and the inhibitor layer is oxide.

13. The electronic device of claim 12 wherein the inhibitor layer of the at least one semiconductor device is low silane flow oxide.

14. The electronic device of claim 11, wherein the at least one semiconductor device further comprises:

the lower region of the capacitor bottom plate is hemispherical silicon grain (HSG) polysilicon;

the upper region of the capacitor bottom plate is smooth polysilicon; and the inhibitor layer is silicon nitride.

\* \* \* \* \*